(12) United States Patent
Zalubovsky

(10) Patent No.: US 10,748,736 B2
(45) Date of Patent: Aug. 18, 2020

(54) LIQUID METAL ROTATING ANODE X-RAY SOURCE FOR SEMICONDUCTOR METROLOGY

(71) Applicant: KLA-Tencor Corporation, Milpitas, CA (US)

(72) Inventor: Sergey Zalubovsky, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 121 days.

(21) Appl. No.: 16/161,525

(22) Filed: Oct. 16, 2018

(65) Prior Publication Data

US 2019/0115184 A1 Apr. 18, 2019

Related U.S. Application Data

(60) Provisional application No. 62/573,958, filed on Oct. 18, 2017.

(51) Int. Cl.
*H01J 35/26* (2006.01)
*H01J 35/10* (2006.01)
(Continued)

(52) U.S. Cl.
CPC ........ *H01J 35/105* (2013.01); *G01N 21/9501* (2013.01); *G01N 23/201* (2013.01);
(Continued)

(58) Field of Classification Search
CPC .... H01J 35/101; H01J 2235/082; H01J 35/10; H01J 35/105; H01J 35/106;
(Continued)

(56) References Cited

U.S. PATENT DOCUMENTS 4,953,191 A 8/1990 Smither et al.
4,972,449 A 11/1990 Upadhya et al.
(Continued)

FOREIGN PATENT DOCUMENTS

| JP | 2008091190 | 4/2008 |
|---|---|---|
| JP | 2016071991 | 5/2016 |
| WO | 2016010448 A1 | 1/2016 |

OTHER PUBLICATIONS

Lemaillet, Germer, Kline et al.,"Intercomparison between optical and x-ray scatterometry measurements of FinFET structures" by Proc. SPIE, v.8681, p. 86810Q (2013).
(Continued)

*Primary Examiner* — Irakli Kiknadze
(74) *Attorney, Agent, or Firm* — Spano Law Group; Joseph S. Spano

(57) ABSTRACT

Methods and systems for realizing a high brightness, liquid based x-ray source suitable for high throughput x-ray metrology are presented herein. A high brightness x-ray source is produced by bombarding a rotating liquid metal anode material with a stream of electrons to generate x-ray radiation. A rotating anode support structure supports the liquid metal anode material in a fixed position with respect to the support structure while rotating at the constant angular velocity. In another aspect, a translational actuator is coupled to the rotating assembly to translate the liquid metal anode in a direction parallel to the axis of rotation. In another aspect, an output window is coupled to the rotating anode support structure. Emitted x-rays are transmitted through the output window toward the specimen under measurement. In another further aspect, a containment window maintains the shape of the liquid metal anode material independent of rotational angular velocity.

21 Claims, 8 Drawing Sheets

(51) Int. Cl.
*G01N 23/201* (2018.01)
*G01N 21/95* (2006.01)
*H01J 35/18* (2006.01)
*H01L 21/66* (2006.01)

(52) U.S. Cl.
CPC ............ *H01J 35/10* (2013.01); *H01J 35/101* (2013.01); *H01J 35/18* (2013.01); *H01J 2235/082* (2013.01); *H01J 2235/1026* (2013.01); *H01L 22/12* (2013.01)

(58) Field of Classification Search
CPC ....... H01J 2235/1026; H01J 2235/1279; H01J 35/18; H01J 35/26; H01J 1/16; H01J 2235/06; H01J 2235/062; H01J 2235/081; H01J 2235/086; H01J 2235/1006; H01J 2235/1046; H01J 2235/108; H01J 2235/1204; H01J 2235/1262; H01J 2235/106; H01J 2235/1086; H01J 2235/1208; H01J 2235/1275; H01J 2235/168; G01N 21/9501; G01N 23/201; H01L 22/12; G06T 7/20; H05B 47/125; H05B 47/155; H05B 47/175
USPC .......................... 378/119, 124, 125, 143, 144
See application file for complete search history.

(56) References Cited

U.S. PATENT DOCUMENTS

| | | |
|---|---|---|
| 5,608,526 A | 3/1997 | Piwonka-Corle et al. |
| 5,859,424 A | 1/1999 | Norton et al. |
| 6,023,338 A | 2/2000 | Bareket |
| 6,185,277 B1 | 2/2001 | Harding |
| 6,192,107 B1 | 2/2001 | Price et al. |
| 6,341,157 B1 | 1/2002 | Sakabe |
| 6,429,943 B1 | 8/2002 | Opsal et al. |
| 6,711,233 B2 | 3/2004 | Hertz et al. |
| 6,716,646 B1 | 4/2004 | Wright et al. |
| 6,778,275 B2 | 8/2004 | Bowes |
| 6,787,773 B1 | 9/2004 | Lee |
| 6,992,764 B1 | 1/2006 | Yang et al. |
| 7,005,774 B2 | 2/2006 | Kuribayashi et al. |
| 7,242,477 B2 | 7/2007 | Mieher et al. |
| 7,321,426 B1 | 1/2008 | Poslaysky et al. |
| 7,406,153 B2 | 7/2008 | Berman |
| 7,440,549 B2 | 10/2008 | Kerpershoek et al. |
| 7,478,019 B2 | 1/2009 | Zangooie et al. |
| 7,483,517 B2 | 1/2009 | Barschdorf et al. |
| 7,518,134 B2 | 4/2009 | Ivanov et al. |
| 7,626,702 B2 | 12/2009 | Ausschnitt et al. |
| 7,656,528 B2 | 2/2010 | Abdulhalim et al. |
| 7,826,071 B2 | 11/2010 | Shchegrov et al. |
| 7,842,933 B2 | 11/2010 | Shur et al. |
| 7,873,585 B2 | 1/2011 | Izikson |
| 7,929,667 B1 | 4/2011 | Zhuang et al. |
| 7,933,026 B2 | 4/2011 | Opsal et al. |
| 8,068,662 B2 | 11/2011 | Zhang et al. |
| 8,138,498 B2 | 3/2012 | Ghinovker |
| 8,243,884 B2 | 8/2012 | Rodhammer et al. |
| 8,565,381 B2 | 10/2013 | Sukowski et al. |
| 8,582,722 B2 | 11/2013 | Tadokoro et al. |
| 8,629,606 B2 | 1/2014 | Kakonyi |
| 9,159,524 B2 | 10/2015 | Hovarth et al. |
| 9,594,036 B2 | 3/2017 | Yun et al. |
| 9,693,439 B1 | 6/2017 | Zhuang et al. |
| 9,715,989 B2 | 7/2017 | Dalakos et al. |
| 9,726,624 B2 | 8/2017 | Ryan et al. |
| 2003/0021465 A1 | 1/2003 | Adel et al. |
| 2004/0223589 A1 | 11/2004 | Martin et al. |
| 2007/0221842 A1 | 9/2007 | Morokuma et al. |
| 2009/0080616 A1* | 3/2009 | Yoshii .................. H01J 35/101 378/133 |
| 2009/0152463 A1 | 6/2009 | Toyoda et al. |
| 2009/0225950 A1 | 10/2009 | Yonezawa et al. |
| 2010/0002842 A1 | 1/2010 | Kerpershoek et al. |
| 2011/0129068 A1 | 6/2011 | Lewalter et al. |
| 2011/0266440 A1 | 11/2011 | Boughorbel et al. |
| 2012/0292502 A1 | 11/2012 | Langer et al. |
| 2013/0208279 A1 | 8/2013 | Smith |
| 2013/0304424 A1 | 11/2013 | Bakeman et al. |
| 2014/0019097 A1 | 1/2014 | Bakeman et al. |
| 2014/0111791 A1 | 4/2014 | Manassen et al. |
| 2014/0172394 A1 | 6/2014 | Kuznetsov et al. |
| 2014/0222380 A1 | 8/2014 | Kuznetsov et al. |
| 2014/0297211 A1 | 10/2014 | Pandev et al. |
| 2014/0314197 A1* | 10/2014 | Watanabe ............... H01J 35/12 378/4 |
| 2014/0369476 A1 | 12/2014 | Harding |
| 2015/0092924 A1 | 4/2015 | Yun et al. |
| 2015/0110249 A1 | 4/2015 | Bakeman et al. |
| 2015/0117610 A1 | 4/2015 | Veldman et al. |
| 2015/0204664 A1 | 7/2015 | Bringoltz et al. |
| 2015/0300965 A1 | 10/2015 | Sezginer et al. |
| 2016/0202193 A1 | 7/2016 | Hench et al. |
| 2016/0320319 A1 | 11/2016 | Hench et al. |
| 2017/0160212 A1 | 6/2017 | Kleine et al. |
| 2017/0167862 A1 | 6/2017 | Dziura et al. |
| 2017/0345611 A1* | 11/2017 | Heid ....................... H01J 35/12 |
| 2018/0106735 A1 | 4/2018 | Gellineau et al. |

OTHER PUBLICATIONS

Kline et al., "X-ray scattering critical dimensional metrology using a compact x-ray source for next generation semiconductor devices," J. Micro/Nanolith. MEMS MOEMS 16(1), 014001 (Jan.-Mar. 2017).
International Search Report dated Feb. 13, 2019, for PCT Application No. PCT/US2018/056564 filed on Oct. 18, 2018 by KLA-Tencor Corporation, 3 pages.

* cited by examiner

LIQUID METAL ROTATING ANODE X-RAY SOURCE FOR SEMICONDUCTOR METROLOGY

CROSS REFERENCE TO RELATED APPLICATION

The present application for patent claims priority under 35 U.S.C. § 119 from U.S. provisional patent application Ser. No. 62/573,958, entitled "X-Ray Source with Liquid Metal Rotating Anode (LiMeRa) for Semiconductor Metrology," filed Oct. 18, 2017, the subject matter of which is incorporated herein by reference in its entirety.

TECHNICAL FIELD

The described embodiments relate to metrology systems and methods, and more particularly to methods and systems for improved illumination.

BACKGROUND INFORMATION

The various features and multiple structural levels of semiconductor devices such as logic and memory devices are typically fabricated by a sequence of processing steps applied to a specimen. For example, lithography among others is one semiconductor fabrication process that involves generating a pattern on a semiconductor wafer. Additional examples of semiconductor fabrication processes include, but are not limited to, chemical-mechanical polishing, etch, deposition, and ion implantation. Multiple semiconductor devices may be fabricated on a single semiconductor wafer and then separated into individual semiconductor devices.

Metrology processes are used at various steps during a semiconductor manufacturing process to detect defects on wafers to promote higher yield. Optical metrology techniques offer the potential for high throughput without the risk of sample destruction. A number of optical metrology based techniques including scatterometry and reflectometry implementations and associated analysis algorithms are commonly used to characterize critical dimensions, film thicknesses, composition and other parameters of nanoscale structures.

As devices (e.g., logic and memory devices) move toward smaller nanometer-scale dimensions, characterization becomes more difficult. Devices incorporating complex three-dimensional geometry and materials with diverse physical properties contribute to characterization difficulty. For example, modern memory structures are often high-aspect ratio, three-dimensional structures that make it difficult for optical radiation to penetrate to the bottom layers. In addition, the increasing number of parameters required to characterize complex structures (e.g., FinFETs), leads to increasing parameter correlation. As a result, the parameters characterizing the target often cannot be reliably decoupled with available measurements. In another example, opaque, high-k materials are increasingly employed in modern semiconductor structures. Optical radiation is often unable to penetrate layers constructed of these materials. As a result, measurements with thin-film scatterometry tools such as ellipsometers or reflectometers are becoming increasingly challenging.

In response, more complex optical tools have been developed. For example, tools with multiple angles of illumination, shorter and broader ranges of illumination wavelengths, and more complete information acquisition from reflected signals (e.g., measuring multiple Mueller matrix elements in addition to the more conventional reflectivity or ellipsometric signals) have been developed. However, these approaches have not reliably overcome fundamental challenges associated with measurement of many advanced targets (e.g., complex 3D structures, structures smaller than 10 nm, structures employing opaque materials) and measurement applications (e.g., line edge roughness and line width roughness measurements).

Atomic force microscopes (AFM) and scanning-tunneling microscopes (STM) are able to achieve atomic resolution, but they can only probe the surface of the specimen. In addition, AFM and STM microscopes require long scanning times. Scanning electron microscopes (SEM) achieve intermediate resolution levels, but are unable to penetrate structures to sufficient depth. Thus, high-aspect ratio holes are not characterized well. In addition, the required charging of the specimen has an adverse effect on imaging performance.

To overcome penetration depth issues, traditional imaging techniques such as TEM, SEM etc., are employed with destructive sample preparation techniques such as focused ion beam (FIB) machining, ion milling, blanket or selective etching, etc. For example, transmission electron microscopes (TEM) achieve high resolution levels and are able to probe arbitrary depths, but TEM requires destructive sectioning of the specimen. Several iterations of material removal and measurement generally provide the information required to measure the critical metrology parameters throughout a three dimensional structure. But, these techniques require sample destruction and lengthy process times. The complexity and time to complete these types of measurements introduces large inaccuracies due to drift of etching and metrology steps. In addition, these techniques require numerous iterations which introduce registration errors.

Another response to recent metrology challenges has been the adoption of x-ray metrology for measurements including film thickness, composition, strain, surface roughness, line edge roughness, and porosity.

Small-Angle X-Ray Scatterometry (SAXS) systems have shown promise to address challenging measurement applications. Various aspects of the application of SAXS technology to the measurement of critical dimensions (CD-SAXS) and overlay (OVL-SAXS) are described in 1) U.S. Pat. No. 7,929,667 to Zhuang and Fielden, entitled "High-brightness X-ray metrology," 2) U.S. Patent Publication No. 2014/0019097 by Bakeman, Shchegrov, Zhao, and Tan, entitled "Model Building And Analysis Engine For Combined X-Ray And Optical Metrology," 3) U.S. Patent Publication No. 2015/0117610 by Veldman, Bakeman, Shchegrov, and Mieher, entitled "Methods and Apparatus For Measuring Semiconductor Device Overlay Using X-Ray Metrology," 4) U.S. Patent Publication No. 2016/0202193 by Hench, Shchegrov, and Bakeman, entitled "Measurement System Optimization For X-Ray Based Metrology," 5) U.S. Patent Publication No. 2017/0167862 by Dziura, Gellineau, and Shchegrov, entitled "X-ray Metrology For High Aspect Ratio Structures," and 6) U.S. Patent Publication No. 2018/0106735 by Gellineau, Dziura, Hench, Veldman, and Zalubovsky, entitled "Full Beam Metrology for X-Ray Scatterometry Systems." The aforementioned patent documents are assigned to KLA-Tencor Corporation, Milpitas, Calif. (USA).

Research on CD-SAXS metrology of semiconductor structures is also described in scientific literature. Most research groups have employed high-brightness X-ray synchrotron sources which are not suitable for use in a semiconductor fabrication facility due to their immense size, cost, etc. One example of such a system is described in the article entitled "Intercomparison between optical and x-ray scatterometry measurements of FinFET structures" by Lemaillet, Germer, Kline et al., Proc. SPIE, v.8681, p. 86810Q (2013). More recently, a group at the National Institute of Standards and Technology (NIST) has initiated research employing compact and bright X-ray sources similar those described in U.S. Pat. No. 7,929,667. This research is described in an article entitled "X-ray scattering critical dimensional metrology using a compact x-ray source for next generation semiconductor devices," J. Micro/Nanolith. MEMS MOEMS 16(1), 014001 (January-March 2017).

SAXS has also been applied to the characterization of materials and other non-semiconductor related applications. Exemplary systems have been commercialized by several companies, including Xenocs SAS (www.xenocs.com), Bruker Corporation (www.bruker.com), and Rigaku Corporation (www.rigaku.com/en).

Many x-ray metrology techniques used in semiconductor manufacturing can benefit from high brightness x-ray sources. For example, critical dimension small angle x-ray scattering (CD-SAXS) measurements often require long integration times due to the low scattering of certain materials. A high brightness source can improve the throughput of CD-SAXS measurements.

Development efforts in the area of extreme ultraviolet (EUV) lithography are focused on light sources that emit narrowband radiation (e.g., +/−0.1 nm) centered at 13 nanometers (i.e., 92.6 electron volts) at high power levels (e.g., 210 watts of average power at the intermediate focus of the illuminator). Light sources for EUV lithography have been developed using a laser droplet plasma architecture. For example, xenon, tin, and lithium droplet targets operating at pulse repetition frequencies of approximately 100 kHz are pumped by CO2 coherent sources. The realized light is high power (e.g., 210 watts of average power at the intermediate focus of the illuminator is the goal for lithography tools at 13 nanometers). However, the resulting radiation is relatively low energy (92.6 electron volts), which severely limits the utility of these illumination sources in metrology applications. An exemplary system is described in U.S. Pat. No. 7,518,134 to ASML Netherlands B.V., the content of which is incorporated herein by reference in its entirety.

In some examples, x-ray illumination light is generated by high energy electron beam bombardment of a solid target material, such as rotating anode target material. Rotating anode X-ray sources are commonly employed for medical imaging and analytical chemistry applications. Numerous versions of rotating anode X-ray sources are manufactured by companies such as Philips, General Electric, Siemens, and others, for medical imaging applications such as tomography, mammography, angiography, etc. Rigaku Corporation and Bruker Corporation manufacture continuously operated rotating anode sources for analytical chemistry applications such as X-Ray diffraction (XRD), X-Ray Reflectometry (XRR), small angle X-Ray scatterometry (SAXS), wide angle X-Ray scatterometry (WARS), etc.

Rotating anode targets enable more effective heat removal from the anode material compared to stationary anode targets. Continuously moving the location of electron beam impingement on the anode surface results in convective heat dissipation that decreases focal spot impact temperature and improves X-ray tube power loading capability. A typical rotating anode source rotates anode material at 5,000-10,000 revolutions per minute, or higher. The linear speed of the anode material at the focal spot location may be 100 meters/second, or higher.

Improvements directed toward increased anode heat dissipation and thermal conductivity have been proposed. For example, the FR-X model X-ray sources manufactured by Rigaku Corporation (Japan) and the MicroMax model X-ray sources manufactured by Bruker AXS GmbH (Germany) employ water cooling to dissipate heat generated at the anode.

U.S. Pat. No. 9,715,989 describes a rotating anode structure with high thermal conductivity diamond layers. U.S. Pat. No. 8,243,884 describes the use of diamond-metal composite materials to improve heat dissipation. U.S. Pat. No. 7,440,549 describes a rotating anode device that dissipates heat by a heat pipe effect. U.S. Patent Publication No. 2015/0092924 describes a microstructural anode including a high atomic number material embedded in a high thermal conductivity matrix. U.S. Pat. No. 9,159,524 and U.S. Pat. No. 9,715,989 describe similar diamond-based heat management solutions in the context of stationary anode sources. The contents of the aforementioned U.S. Patents and U.S. Patent Publications are incorporated herein by reference in their entirety.

Despite improved power loading capabilities, rotating anode sources suffer from significant limitations. In practice, microcracks form at the surface of the solid anode material located on the focal track (i.e., the locus of points repeatedly subjected to e-beam impingement) due to repeated thermal cycling. These microcracks introduce losses due to increased absorption. In some examples, a 20-30% drop in X-ray flux occurs within the first 1,000 hours of source operation. In addition, a typical rotating anode requires re-polishing (i.e., restoration of the surface of the anode material) approximately every 3,000 hours. In addition, in some examples, high rotation speeds limit X-ray spot size and spatial stability of the X-ray spot.

In some other examples, x-ray illumination light is generated by high energy electron beam bombardment of a liquid target material to mitigate the formation of surface microcracks associated with solid anode targets.

In some of these examples, a liquid metal jet anode is employed. An exemplary liquid metal jet x-ray illumination system is described in U.S. Pat. No. 7,929,667 to Zhuang and Fielden, the content of which is incorporated herein by reference in its entirety. Another exemplary liquid metal jet x-ray illumination source is described in U.S. Pat. No. 6,711,233, the content of which is incorporated herein by reference in its entirety. The liquid metal jet effectively refreshes the anode surface continuously to eliminate the formation of surface microcracks. However, the liquid metal anode material does evaporate and form a metal vapor that may limit x-ray source lifetime. In some examples, the metal vapor condenses on the vacuum x-ray window causing additional x-ray absorption. In some examples, the metal vapor diffuses into the cathode region and contaminates the cathode, reducing cathode lifetime and system output. In some examples, the metal vapor diffuses into the electron beam acceleration region causing high-voltage breakdowns.

In some other examples, a liquid metal anode is flowed over a stationary structure. U.S. Pat. No. 4,953,191 describes a liquid metal anode material flowing over a stationary metal surface, the content of which is incorporated herein by reference in its entirety. U.S. Pat. No. 8,629,606 describes a liquid metal anode material flowing on internal surfaces of an X-ray source vacuum enclosure, the content of which is incorporated herein by reference in its entirety. U.S. Patent Publication No. 2014/0369476 and U.S. Pat. No. 8,565,381 describe a liquid metal anode material flowing through a channel or tube, the content of each is incorporated herein by reference in its entirety. The fast moving liquid metal is enclosed in part by suitable windows to allow electron beam penetration and X-ray extraction.

Despite improved power loading capabilities, liquid anode sources suffer from significant limitations. In practice, flowing thin liquid metal layers over other surfaces is limited to relatively low velocity flow. As flow velocity increases, turbulence arises, which destabilizes the X-ray illumination source. As a result, anode power loading of an X-ray source employing liquid anode material flowing over another surface is significantly limited. In addition, anode power loading for X-ray illumination sources based on flowing liquid metal inside channels and tubes is limited by the structural integrity of any windows employed to contain the flow and allow electron beam penetration and X-ray extraction.

Similarly, stable operation of a liquid metal jet X-ray illumination source requires a laminar liquid metal jet flow. Therefore, any increase in jet speed to accommodate increased anode power loading is limited by the laminar-turbulent transition of the jet itself and the feasibility of an ultra-high-pressure jet return loop required to achieve any increased jet velocity.

Unfortunately, X-ray based metrology throughput is impaired by limited power loading on the anode. An increase in power loading of a conventional solid metal anode source causes ablation and destruction of the anode. For typical liquid metal sources, an increase in power loading tends to destabilize the X-ray illumination source.

Future metrology applications present challenges for metrology due to increasingly high resolution requirements, multi-parameter correlation, increasingly complex geometric structures, and increasing use of opaque materials. The adoption of x-ray metrology for semiconductor applications requires improved x-ray sources with the highest possible brightness.

SUMMARY

Methods and systems for realizing a high brightness, liquid based x-ray source suitable for high throughput x-ray metrology are presented herein.

In one aspect, a high brightness x-ray source is produced by bombarding a rotating liquid metal anode material with a stream of electrons to generate x-ray radiation. A rotating anode support structure supports the liquid metal anode material in a fixed position with respect to the rotating anode support structure while the rotating anode support structure is rotating at the constant angular velocity. The resulting x-ray emission is collected and provided to a semiconductor specimen to perform x-ray based metrology on the specimen.

The liquid metal material surface does not degrade (e.g., crack) under cyclic thermal stress induced by periodic bombardment by the stream of electrons. The liquid metal material surface is effectively self-healing, which is a significant advantage over solid anode materials. As a result, the rotating anode, liquid metal x-ray source improves brightness and reliability, increases the time interval between service, and decreases down time compared to traditional rotating solid anode x-ray sources.

In another aspect, x-ray optics are configured at specific collection angles to capture x-ray emission in the desired energy band at peak intensity. In some embodiments, x-ray optics are designed to directly focus x-ray radiation to the measurement target. In some embodiments, x-ray collection optics are oriented in such a way as to optimize x-ray brightness by collecting x-ray radiation over a range of collection angles.

In a further aspect, a translational actuator is coupled to the rotating assembly that causes the rotating assembly to also translate in a direction parallel to the axis of rotation.

In another further aspect, an output window is coupled to the rotating anode support structure, and x-rays emitted by the liquid metal anode material are transmitted through the output window toward the specimen under measurement.

In another further aspect, a containment window is coupled to the rotating anode support structure, and the incident stream of electrons are transmitted through the containment window before incidence with liquid metal anode material.

The foregoing is a summary and thus contains, by necessity, simplifications, generalizations and omissions of detail; consequently, those skilled in the art will appreciate that the summary is illustrative only and is not limiting in any way. Other aspects, inventive features, and advantages of the devices and/or processes described herein will become apparent in the non-limiting detailed description set forth herein.

DETAILED DESCRIPTION

Reference will now be made in detail to background examples and some embodiments of the invention, examples of which are illustrated in the accompanying drawings.

Systems employed to measure structural and material characteristics (e.g., material composition, dimensional characteristics of structures and films, etc.) associated with different semiconductor fabrication processes based on x-ray illumination are presented. More specifically, methods and systems for realizing a high brightness, liquid based x-ray source suitable for high throughput x-ray metrology are presented herein.

In one aspect, a high brightness x-ray source is produced by bombarding a rotating liquid metal anode material with a stream of electrons to generate x-ray radiation. The resulting x-ray emission is collected and provided to a semiconductor specimen to perform x-ray based metrology on the specimen.

The liquid metal material surface does not degrade (e.g., crack) under cyclic thermal stress induced by periodic bombardment by the stream of electrons. The liquid metal material surface is effectively self-healing, which is a significant advantage over solid anode materials. As a result, the rotating anode, liquid metal x-ray source improves brightness and reliability, increases the time interval between service, and decreases down time compared to traditional rotating solid anode x-ray sources.

Furthermore, by eliminating the problem of surface degradation, overall power loading on the liquid metal anode material may be increased. In addition, the incident electron beam may be focused with greater intensity to yield brighter x-ray emission useable for semiconductor metrology.

The high energy nature of x-ray radiation allows for the penetration of x-rays into optically opaque thin films, buried structures, high-aspect ratio structures and devices containing many thin film layers. Many x-ray metrology techniques used in semiconductor manufacturing benefit from a high brightness, reliable x-ray source, e.g., critical dimension small angle x-ray scattering (CD-SAXS).

Measurements often need long integration times due to the low scattering efficiency of materials comprising many modern semiconductor structures. A high brightness high power liquid metal rotating anode x-ray source improves the throughput of x-ray based measurements, e.g., CD-SAXS.

Figure 1:
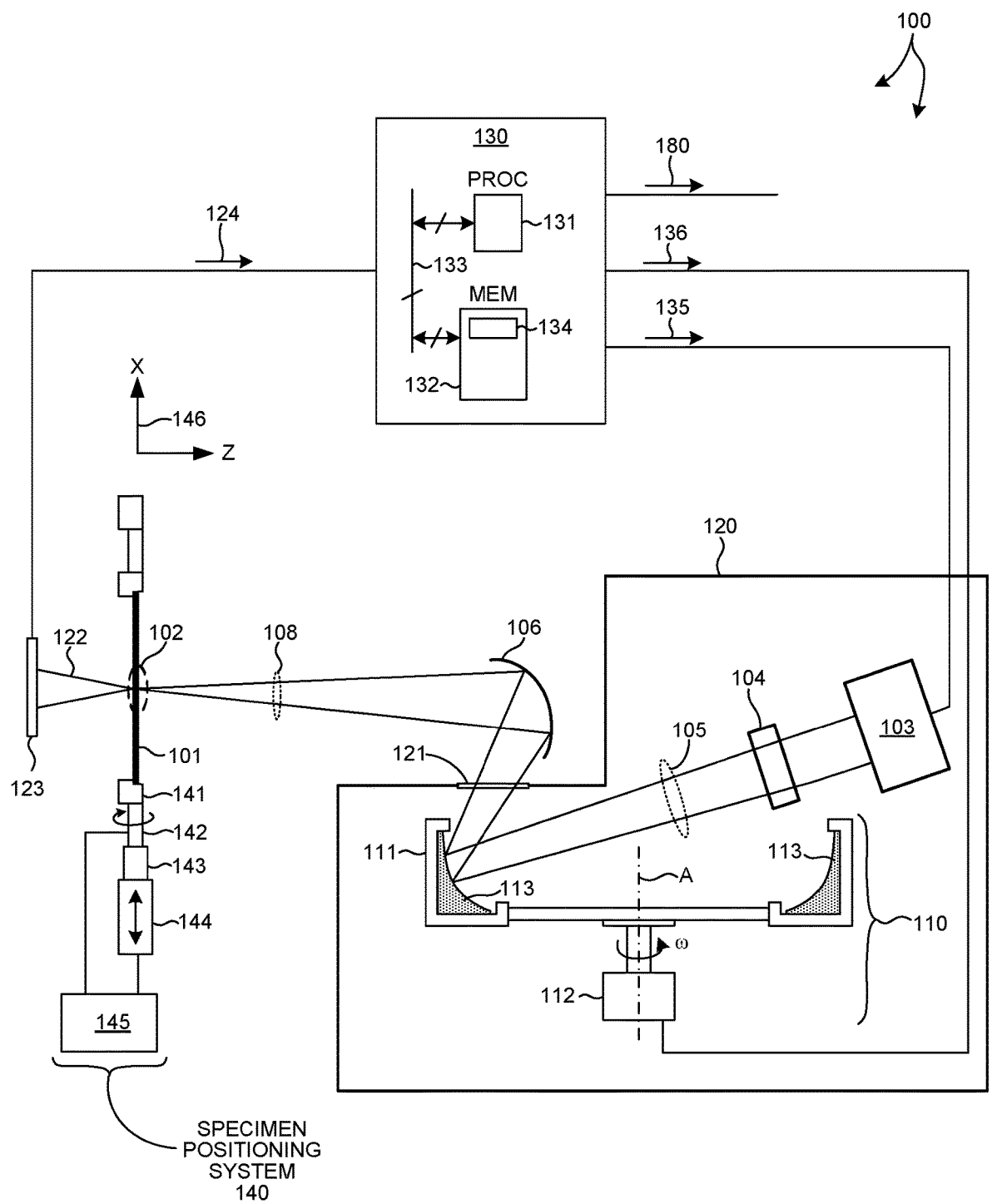
FIG. 1 is a diagram illustrative of an x-ray metrology system 100 for performing semiconductor metrology measurements including a liquid metal rotating anode (LiMeRa) x-ray illumination source in at least one aspect.

FIG. 1 illustrates an embodiment of an x-ray based metrology system 100 including a liquid metal rotating anode (LiMeRa) x-ray illumination source in one embodiment. By way of non-limiting example, x-ray metrology system 100 operates in a transmission mode. As depicted in FIG. 1, the LiMeRa x-ray illumination source includes an electron beam source 103 and a rotating anode assembly 110.

The rotating anode assembly 110 includes a rotational actuator 112 that rotates a rotating anode support structure 111 about an axis of rotation, A, at an angular velocity, ω. The rotating anode assembly 110 also includes a liquid metal anode material 113 supported by rotating anode support structure 111. The rotation induces a centrifugal force on liquid metal anode material 113 that conforms liquid metal anode material 113 to the shape of the rotating anode support structure 111, and distributes the liquid metal anode material 113 evenly along the circumference of the rotating anode support structure 111. At constant angular velocity, a steady state distribution of liquid metal anode material 113 on the surface of rotating anode support structure 111, and the liquid metal anode material 113 is not moving with respect to the rotating anode support structure 111. In other words, the liquid metal anode material 113 and the rotating anode support structure 111 are moving together with respect to the electron beam source 103, but not with respect to one another.

In the embodiment depicted in FIG. 1, computing system 130 is communicatively coupled to rotary actuator 112. In one example, command signals 136 are communicated to rotary actuator 112 from computing system 130 indicating a desired angular velocity of the rotating anode support structure 111. In response, rotary actuator 112 adjusts the angular velocity of the rotating anode support structure 111 based on the command signals 136.

In the embodiment depicted in FIG. 1, the LiMeRa x-ray illumination source provides high brightness x-ray illumination delivered to a specimen 101 over an inspection area 102. X-ray metrology system 100 is configured such that x-rays which interact with the specimen 101 are collected by a detector 123 while a specimen positioning system 140 positions the specimen to produce angularly resolved interactions of the sample with the x-rays. In some embodiments, any other particles produced during the interaction such as photoelectrons, x-rays produced through fluorescence, or ions may also be detected.

In the embodiment depicted in FIG. 1, the LiMeRa x-ray illumination source includes an electron beam source 103 (e.g., electron gun) configured to generate electron emission from a cathode. In the depicted embodiment, electron beam source 103 generates a stable stream of free electrons 105. The stream of electrons 105 is shaped by electron optics 104 and is incident on liquid metal anode material 113 supported by rotating anode support structure 111. In some embodiments, the electron beam source 103 is configured to generate a continuous electron beam. In some other embodiments, the electron beam source 103 is configured to generate a pulsed electron beam.

In the embodiment depicted in FIG. 1, electron beam source 103 is communicatively coupled to computing system 130, and electron beam source 103 is actively controlled based on command signals 135 communicated from computing system 130 to electron beam source 103. In some examples, command signals 135 include an indication of desired electron beam energy to be supplied by electron beam source 103. In response, electron beam source 103 adjusts electron beam energy output to the desired value. In some embodiments, the electron beam source 103 accelerates the stream of focused electrons 105 with a voltage differential greater than 10 kV.

Electron optics 104 are configured to direct and/or focus the stream of electrons 105 toward the liquid metal anode material 113. Electron optics 104 includes suitable electromagnets, permanent magnets, or any combination of electromagnets and permanent magnets for focusing the electron beam and directing the stream of electrons 105. In some embodiments, electron optics 104 may include solenoids, quadrupole lenses such as Halbach cylinders or electrostatic elements such as Einzel lenses to focus and direct the electron beam. In addition, electron optics 104 may be configured as an electron monochromator. Moreover, electron optics 104 may be employed to focus the beam to further reduce electron beam noise.

In addition, electron optics 104 may be configured for active control by computing system 130. In some embodiments (not shown), computing system 130 is communicatively coupled to electron optics 104. In some examples, current or voltage supplied to electromagnetic elements may be actively controlled based on command signals communicated from computing system 130 to electron optics 104. In another example, the position of a magnetic element (e.g., a permanent magnet) may be manipulated by a positioning system (not shown) based on command signals communicated from computing system 130 to electron optics 104. In this manner, the focusing and directing of the stream of electrons 105 is achieved under the control of computing system 130 to achieve a stable stream of electrons 105 incident on liquid metal anode material 113.

As depicted in FIG. 1, x-ray optics 106 are configured to collect x-ray emission from the spot of incidence of the stream of electrons 105 and liquid metal anode material 113 and shape and direct incident x-ray beam 108 to specimen 101.

In another aspect, x-ray optics 106 are configured at specific collection angles to capture x-ray emission in the desired energy band at peak intensity. In some embodiments, x-ray optics 106 are designed to directly focus x-ray radiation to the measurement target. When a high energy focused electron beam impinges upon a liquid metal anode target, the stimulated x-ray emission includes broadband Bremsstrahlung radiation and characteristic line emission (i.e., $K\alpha$, $K\beta$, $L\alpha$, $L\beta$, etc.). In some embodiments, x-ray collection optics are oriented in such a way as to optimize x-ray brightness by collecting x-ray radiation over a range of collection angles.

In some examples, x-ray optics 106 monochromatize the x-ray beam that is incident on the specimen 101. In some examples, x-ray optics 106 collimate or focus the x-ray beam 108 onto inspection area 102 of specimen 101. In some embodiments, x-ray optics 106 includes one or more x-ray collimating mirrors, x-ray apertures, x-ray monochromators, and x-ray beam stops, multilayer optics, refractive x-ray optics, diffractive optics such as zone plates, or any combination thereof.

In some embodiments, advanced x-ray optics such as polycapillary x-ray optics, specular optics, or optics arranged in a Loxley-Tanner-Bowen configuration are employed to achieve high-brightness, small spot size illumination of a semiconductor specimen. For example, high intensity x-ray beams can be transported and focused to spot sizes of less than 40 micrometers using specular x-ray optics such as grazing incidence ellipsoidal mirrors, polycapillary optics such as hollow capillary x-ray waveguides, multilayer optics, or crystalline optics such as a Loxley-Tanner-Bowen system.

In preferred embodiments, x-ray optics 106 are multilayer optics. In some of these embodiments, multilayer optics are employed to monochromatize the x-ray beam 108 to a spectral purity, $\delta\lambda/\lambda$, of less than 10-1. This level of spectral purity is suitable for metrology technologies such as x-ray reflectivity (XRR), x-ray diffraction (XRD), and x-ray fluorescence (XRF). In some other embodiments, crystal monochromators are employed to monochromatize the x-ray beam 108 to a spectral purity, $\delta\lambda/\lambda$, of less than 10-6. This level of spectral purity is suitable for metrology technologies such as high resolution x-ray diffraction (HRXRD).

X-ray optics 106 may be configured for active control by computing system 130. In some embodiments, computing system 130 is communicatively coupled to x-ray optics 106 (not shown). In one example, command signals communicated to x-ray optics 106 from computing system 130 indicate a desired position of an optical element. The position of the optical element may be adjusted by a positioning system (not shown) based on the command signal. In this manner, the focusing and directing of the x-ray beam 108 is achieved under the control of computing system 130 to achieve a stable illumination incident on specimen 101. In some examples, computing system 130 is configured to control the positioning and spot size of the x-ray beam 108 incident on specimen 101. In some examples, computing system 130 is configured to control illumination properties of the x-ray beam 108 (e.g., intensity, polarization, spectrum, etc.).

As depicted in FIG. 1, x-ray detector 123 collects x-ray radiation 122 scattered from specimen 101 in response to the incident x-ray illumination and generates an output signal 124 indicative of properties of specimen 101 that are sensitive to the incident x-ray radiation. Scattered x-rays 122 are collected by x-ray detector 123 while specimen positioning system 140 locates and orients specimen 101 to produce angularly resolved scattered x-rays.

As depicted in FIG. 1, the LiMeRa x-ray source is maintained in a vacuum environment maintained within vacuum chamber 120. X-ray emission passes through vacuum window 121 as the x-rays propagate from liquid metal anode material 113 toward x-ray optics 106.

Figure 2A:
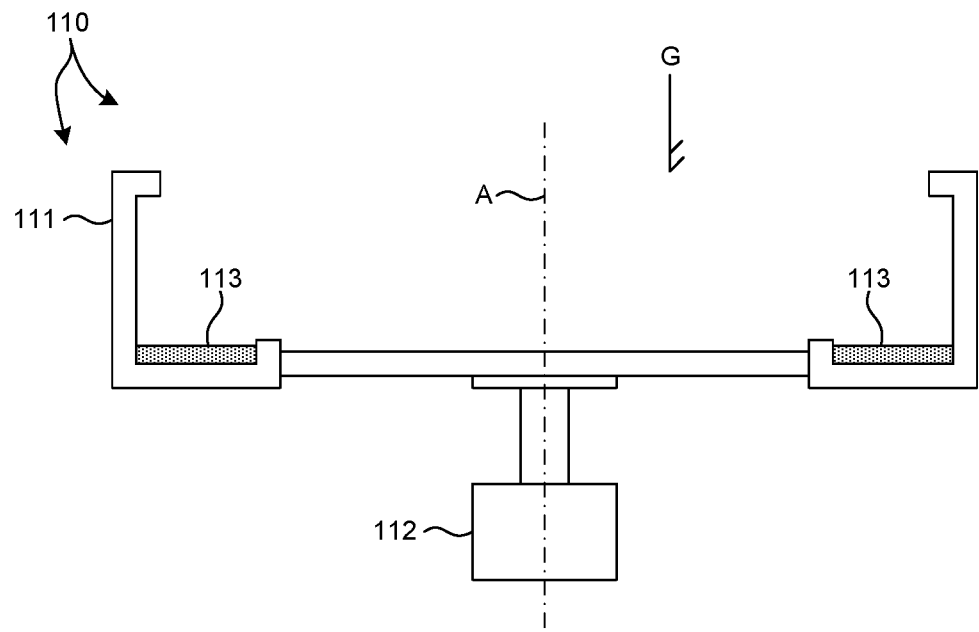
FIG. 2A is a diagram illustrative of an instance of a rotating anode assembly of a (LiMeRa) x-ray illumination source in one embodiment.

FIG. 2A depicts rotating anode assembly 110 depicted in FIG. 1 in one instance. In the instance depicted in FIG. 2A, the angular velocity of the rotating anode assembly 110 is zero (i.e., at rest). In this instance, there are no centrifugal forces acting on liquid metal anode material 113. As a result, the gravitational forces acting on the liquid metal anode material 113 dominate dynamic forces, and liquid metal anode material 113 conforms to the shape of rotating anode support structure 111 in the direction perpendicular to the gravity vector, G. Rotating anode support structure 111 is shaped such that liquid metal anode material 113 is constrained to remain in contact with rotating anode support structure 111 when angular velocity is zero. In other words, rotating anode support structure 111 is shaped such that liquid metal anode material 113 does not spill and is not lost when angular velocity is zero.

Figure 2B:
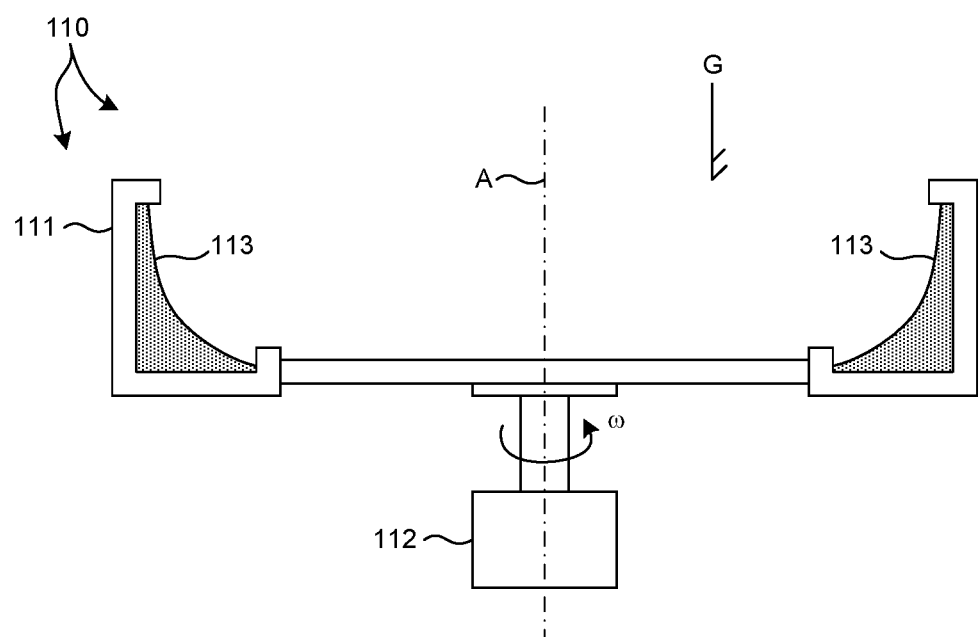
FIG. 2B is a diagram illustrative of another instance of the rotating anode assembly of a (LiMeRa) x-ray illumination source in the embodiment illustrated in FIG. 2A.

FIG. 2B depicts rotating anode assembly 110 depicted in FIG. 1 in another instance. In the instance depicted in FIG. 2B, the angular velocity of the rotating anode assembly 110 is a constant value, $\omega$. In this instance, centrifugal forces act on liquid metal anode material 113, in addition to the gravitational forces acting on the liquid metal anode material 113. As a result, the liquid metal anode material 113 also conforms to the shape of rotating anode support structure 111 in the direction parallel to the axis of rotation, A. Rotating anode support structure 111 is shaped such that liquid metal anode material 113 is constrained to remain in contact with rotating anode support structure 111 when angular velocity is nonzero. In other words, rotating anode support structure 111 is shaped such that liquid metal anode material 113 does not spill and is not lost when angular velocity is nonzero. In a further aspect, the rotating anode support structure supports the liquid metal anode material in a fixed position with respect to the rotating anode support structure while the rotating anode support structure is rotating at the constant angular velocity. In other words, the liquid metal anode material does not flow with respect to the rotating anode support structure, while the rotating anode support structure is rotating at constant angular velocity.

In a further aspect, a translational actuator is coupled to the rotating assembly that causes the rotating assembly to also translate in a direction parallel to the axis of rotation, A.

Figure 3:
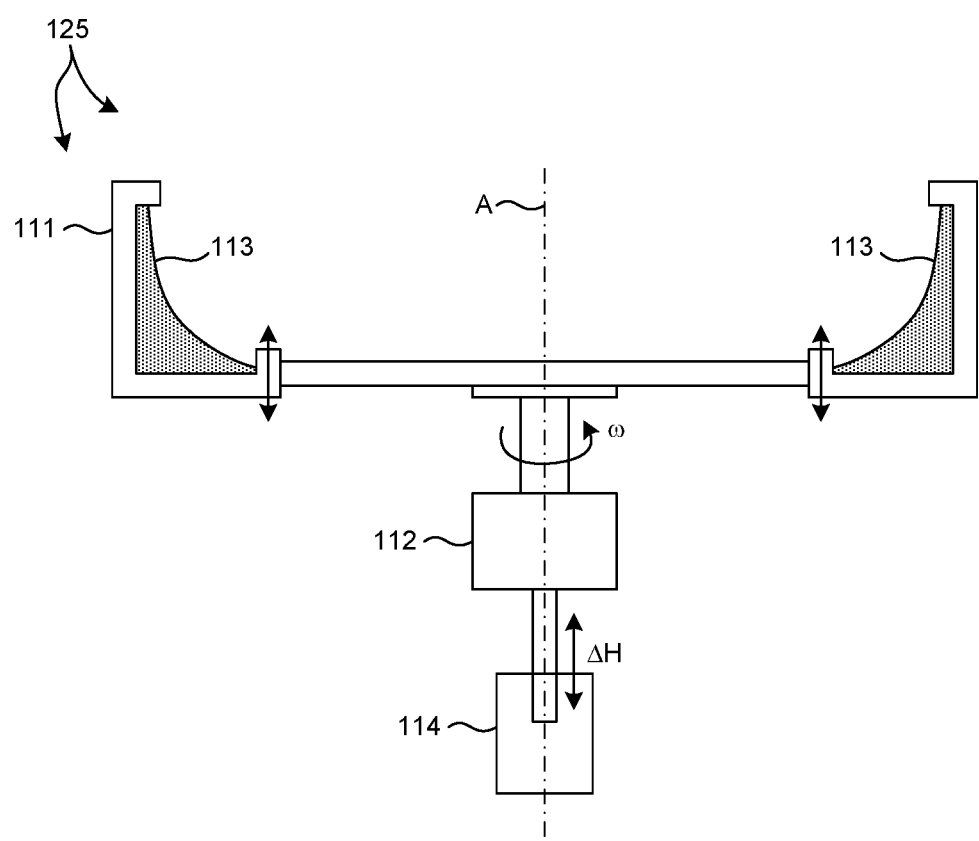
FIG. 3 depicts a rotating anode assembly of a LiMeRa x-ray illumination source in another embodiment.

FIG. 3 depicts a rotating assembly 125 including rotating anode support structure 111, rotary actuator 112, liquid metal anode material 113, and a translational actuator 114. In the embodiment depicted in FIG. 3, translational actuator 114 is coupled to rotary actuator 112 and oscillates the rotating assembly with an amplitude, $\alpha H$, in a direction parallel to axis of rotation, A. The rotational motion of the liquid metal anode material 113 effectively changes the location of incidence of the stream of electrons 105 with respect to the liquid metal anode material 113 circumferentially. The translational motion of the liquid metal anode material 113 effectively changes the location of incidence of the stream of electrons 105 with respect to the liquid metal anode material 113 in a direction parallel to the axis of rotation. This effectively spreads the heat load imposed on the liquid metal anode material 113 by the stream of electrons 105 over a larger area.

In another further aspect, an output window is coupled to the rotating anode support structure, and x-rays emitted by the liquid metal anode material are transmitted through the output window toward the specimen under measurement.

Figure 4:
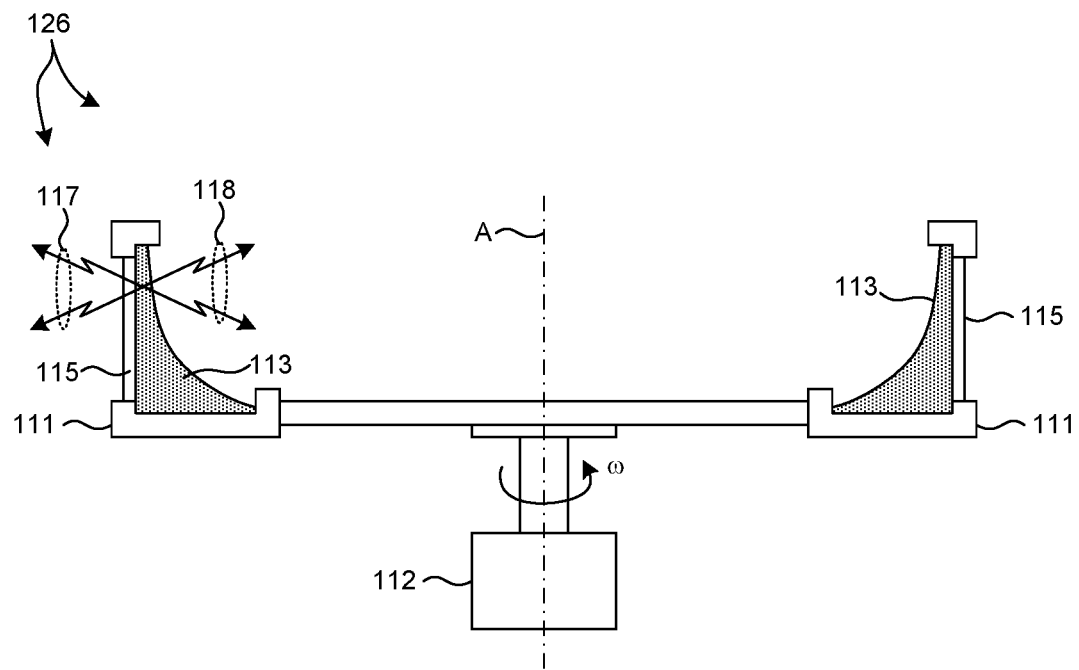
FIG. 4 depicts a rotating anode assembly of a LiMeRa x-ray illumination source in yet another embodiment.

FIG. 4 depicts a rotating assembly 126 including rotating anode support structure 111, rotary actuator 112, liquid metal anode material 113, and an output window 115. In the embodiment depicted in FIG. 4, an output window 115 that is substantially transparent to x-ray radiation is coupled to rotating anode support structure 111. X-rays 117 emitted from liquid metal anode material 113 are transmitted through output window 115. A metrology system, such as metrology system 100, includes x-ray optical elements that collect and direct the transmitted x-ray radiation 117 toward specimen 101 under measurement. In this manner, x-ray radiation is also collected in a tranmissive mode, rather than, or in addition to x-ray radiation collected directly from the exposed surface of liquid metal anode material 113 (e.g., x-ray radiation 118).

In another further aspect, a containment window is coupled to the rotating anode support structure, and the incident stream of electrons 105 are transmitted through the containment window before incidence with liquid metal anode material 113.

Figure 5:
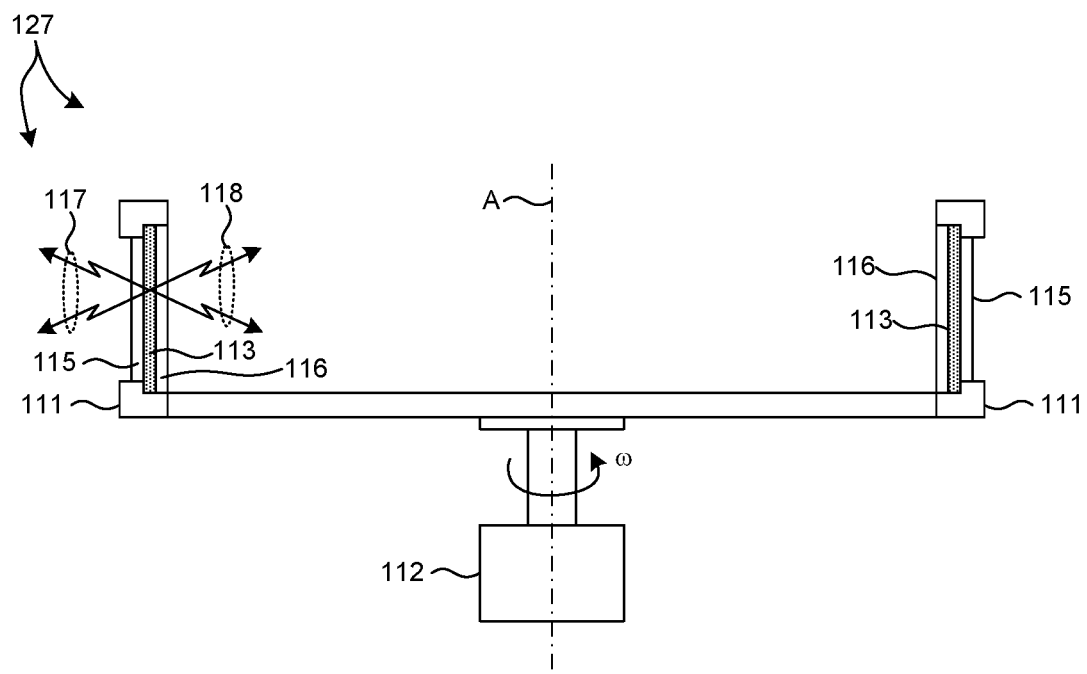
FIG. 5 depicts a rotating anode assembly of a LiMeRa x-ray illumination source in yet another embodiment.

FIG. 5 depicts a rotating assembly 127 including rotating anode support structure 111, rotary actuator 112, liquid metal anode material 113, output window 115, and containment window 116. In the embodiment depicted in FIG. 5, a containment window 116 that is substantially transparent to the stream of electrons 105 is coupled to rotating anode support structure 111, and effectively constrains the liquid metal anode material 113 to a fixed shape with respect to the rotating anode support structure regardless of angular velocity. As depicted in FIG. 4B, liquid metal anode material 113 is effectively trapped between containment window 116 and output window 115. In this manner, liquid metal anode material 113 does not change shape regardless of angular velocity. In embodiments that do not employ an output window, liquid metal anode material 113 is effectively trapped between containment window 116 and rotating anode support structure 111. In the embodiment depicted in FIG. 5, x-rays 117 emitted from liquid metal anode material 113 are transmitted through output window 115, and x-ray radiation 118 is also collected directly from the exposed surface of liquid metal anode material 113. However, in general, x-ray radiation may be collected directly from the exposed surface of liquid metal anode material 113, as transmitted through output window 115, or both.

FIGS. 1-4 depict embodiments of the rotating anode support structure that support the liquid metal anode material such that the liquid metal anode material assumes a different shape when the rotating anode support structure is rotated at different, constant angular velocities. More specifically, the cross-sectional views of the liquid metal anode material 113 illustrated in FIGS. 1-4 show a cross-section of liquid metal anode material which revolves around the axis of rotation, A, and the exact cross-sectional shape depends on the angular velocity of the rotation of the rotating anode support structure. In contrast, FIG. 5 depicts an embodiment of the rotating anode support structure that supports the liquid metal anode material such that the liquid metal anode material assumes approximately the same shape independent of the angular velocity of the rotating anode support structure.

Figure 6A:
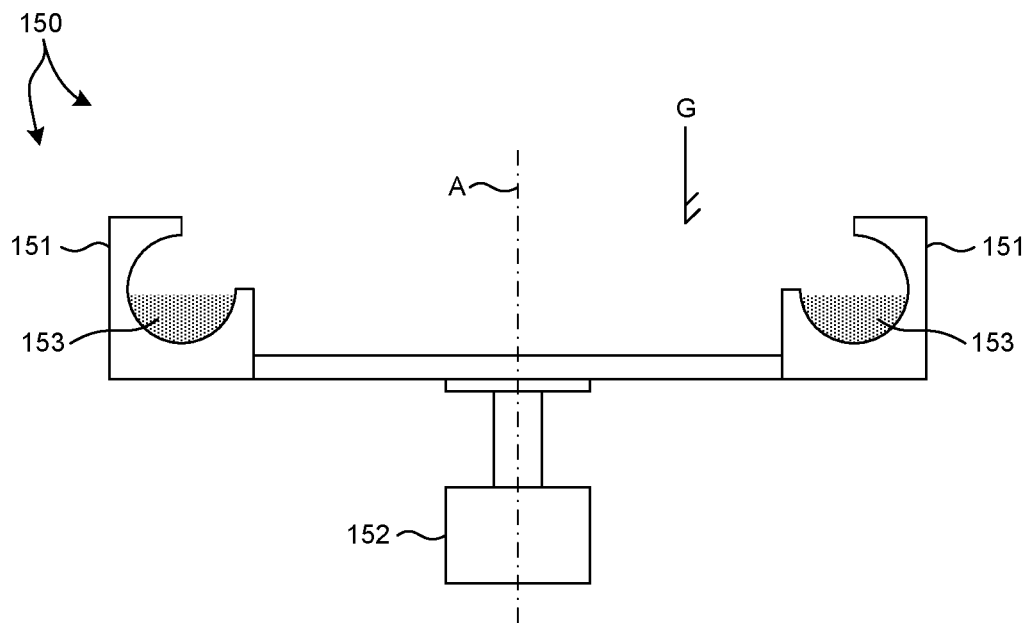
FIG. 6A is a diagram illustrative of an instance of a rotating anode assembly of a (LiMeRa) x-ray illumination source in yet another embodiment.
Figure 6B:
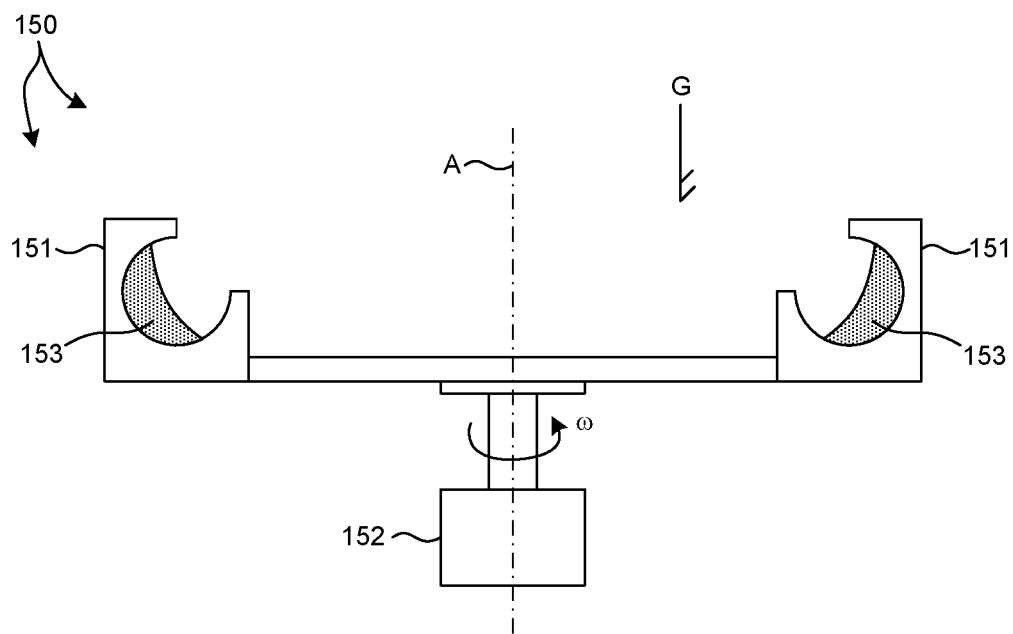
FIG. 6B is a diagram illustrative of another instance of the rotating anode assembly of a (LiMeRa) x-ray illumination source in the embodiment illustrated in FIG. 5A.

In general, many different shapes may be contemplated. FIGS. 6A-6B depict an embodiment 150 of a rotating assembly 150 including a rotating anode support structure 151, a rotary actuator 152, and a liquid metal anode material 153. In the embodiment 150, the rotating support structure 151 supports the liquid metal anode material such that the liquid metal anode material assumes a toroidal shape while the rotating anode support structure is rotated at constant angular velocity. More specifically, the cross-sectional views of the liquid metal anode material 153 illustrated in FIGS. 6A-6B show the liquid metal anode material conforming to a semicircular shape of the rotating anode support structure 151.

FIG. 6A depicts rotating anode assembly 150 in one instance. In the instance depicted in FIG. 6A, the angular velocity of the rotating anode assembly 150 is zero (i.e., at rest). In this instance, there are no centrifugal forces acting on liquid metal anode material 153. As a result, the gravitational forces acting on the liquid metal anode material 153 dominate dynamic forces, and liquid metal anode material 153 conforms to the shape of rotating anode support structure 151 in the direction perpendicular to the gravity vector, G. Rotating anode support structure 151 is shaped such that liquid metal anode material 153 is constrained to remain in contact with rotating anode support structure 151 when angular velocity is zero. In other words, rotating anode support structure 151 is shaped such that liquid metal anode material 153 does not spill and is not lost when angular velocity is zero.

FIG. 6B depicts rotating anode assembly 150 in another instance. In the instance depicted in FIG. 6B, the angular velocity of the rotating anode assembly 150 is a constant value, $\omega$. In this instance, centrifugal forces act on liquid metal anode material 153 in addition to the gravitational forces acting on the liquid metal anode material 153. As a result, the liquid metal anode material 153 also conforms to the shape of rotating anode support structure 151 in the direction parallel to the axis of rotation, A. Rotating anode support structure 151 is shaped such that liquid metal anode material 153 is constrained to remain in contact with rotating anode support structure 151 when angular velocity is nonzero. In other words, rotating anode support structure 111 is shaped such that liquid metal anode material 153 does not spill and is not lost when angular velocity is nonzero.

Figure 7:
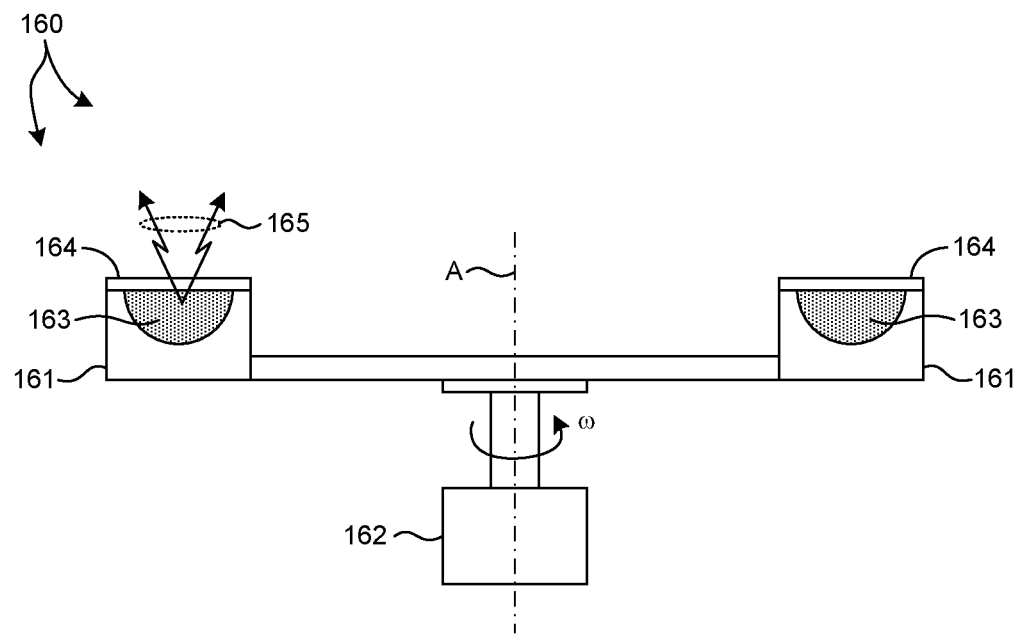
FIG. 7 depicts a rotating anode assembly of a LiMeRa x-ray illumination source in yet another embodiment.

FIG. 7 depicts a rotating assembly 160 including rotating anode support structure 161, rotary actuator 162, liquid metal anode material 163, and containment window 164. In the embodiment depicted in FIG. 7, a containment window 164 that is substantially transparent to the stream of electrons 105 is coupled to rotating anode support structure 161, and effectively constrains the liquid metal anode material 163 to a fixed shape with respect to the rotating anode support structure regardless of angular velocity. As depicted in FIG. 7, liquid metal anode material 163 is effectively trapped between containment window 164 and rotating anode support structure 161. In this manner, liquid metal anode material 163 does not change shape regardless of angular velocity. Liquid metal anode material 163 is effectively trapped between containment window 164 and rotating anode support structure 161. In the embodiment depicted in FIG. 7, x-rays 165 emitted from liquid metal anode material 163 are transmitted through containment window 164.

In general, a rotating anode support structure, a containment window, and an output window may be fabricated from metal, graphite, diamond, or any combination of thereof.

In general, x-ray energy and generation efficiency scale with the elemental atomic number, Z, of the anode material. With some exceptions, the higher the atomic number, the higher the x-ray energy (i.e., shorter wavelength) and yield efficiency. Unfortunately, many materials having a relatively high atomic number also have high melting temperatures.

Liquid metal materials suitable for implementation as a liquid metal anode material in a LiMeRa x-ray illumination source as described herein include Gallium, Indium, Tin, Thallium, Cadmium, Bismuth, Lead, Antimony, Silver, Gold, and any combination thereof. In addition, liquid metal anode alloys that include any of Gallium, Indium, Tin, Thallium, Cadmium, Bismuth, Lead, Antimony, Silver, and Gold may also be contemplated within the scope of this patent document. An example alloy is Wood's metal, which is a eutectic, fusible alloy with a melting point of approximately 70° C. (158° F.). It is a eutectic alloy including 50% bismuth, 26.7% lead, 13.3% tin, and 10% cadmium by weight.

In a preferred example, the liquid metal anode material is Indium (Z=49), or an alloy including Indium. Conventional metals or refractory materials may be employed to stably support melted Indium. Furthermore, conventional heating devices may be employed to maintain liquid Indium at a temperature above its melting point of 156° C. Similarly, conventional metals or refractory materials may be employed to stably support melted Tin (Z=50), and conventional heating devices may be employed to maintain liquid Tin at a temperature above its melting point of 232° C.

The coincidence of the liquid metal anode 113 and the stream of electrons 105 produces x-ray emission 108 incident on inspection area 102 of specimen 101. A LiMeRa x-ray illumination source collects K-shell emission, L-shell emission, or a combination thereof, from the liquid metal anode material. In some embodiments, it is preferred to have a x-ray source photon energy in a range from 10 keV to 25 keV to penetrate through a silicon wafer with suitable transmission efficiency for Transmission Small Angle X-ray Scattering (T-SAXS) based semiconductor metrology applications such as critical dimension and overlay metrology on patterned silicon wafers.

In some embodiments, the distance between specimen 101 and liquid metal anode material 113 is lengthy (e.g., greater than one meter). In these embodiments, air present in the beam path introduces undesirable beam scattering. Hence, in some embodiments it is preferred to propagate x-ray beam 108 through an evacuated flight tube from the LiMeRa illumination source to specimen 101.

Figure 8:
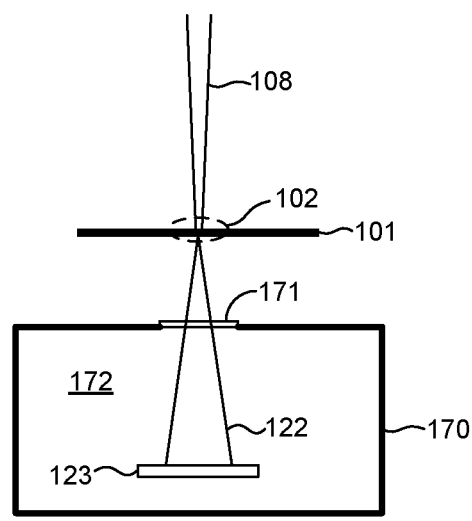
FIG. 8 is a diagram illustrative of an x-ray detector 123 of x-ray metrology system 100 contained in a vacuum environment 172 separate from specimen 101.

In some embodiments, the x-ray detector 123 is maintained in the same atmospheric environment as specimen 101 (e.g., gas purge environment). However, in some embodiments, the distance between specimen 101 and x-ray detector 123 is lengthy (e.g., greater than one meter). In these embodiments, air present in the beam path introduces undesirable beam scattering, especially when the LiMeRa illumination source is configured to generate hard x-rays (e.g., photon energy greater than 5 keV). Hence in some embodiments, the x-ray detector 123 is maintained in a localized, vacuum environment separated from the specimen (e.g., specimen 101) by a vacuum window. FIG. 8 is a diagram illustrative of a vacuum chamber 170 containing x-ray detector 123. In a preferred embodiment, vacuum chamber 170 includes a substantial portion of the path between specimen 101 and x-ray detector 123. An opening of vacuum chamber 170 is covered by vacuum window 171. Vacuum window 171 may be constructed of any suitable material that is substantially transparent to x-ray radiation (e.g., Kapton, Beryllium, etc.). Scattered x-ray radiation 122 passes through vacuum window 171, enters vacuum chamber 170 and is incident on x-ray detector 123. A suitable vacuum environment 172 is maintained within vacuum chamber 170 to minimize disturbances to scattered x-ray radiation 122.

In some embodiments, it is desirable to maintain the x-ray illumination beam 108, specimen 101, the collection beam 122, and detector 123 in an evacuated environment to minimize absorption of x-rays. This is especially desirable if the LiMeRa illumination source is configured to generate soft x-rays (e.g., photon energy less than 5 keV).

Figure 9:
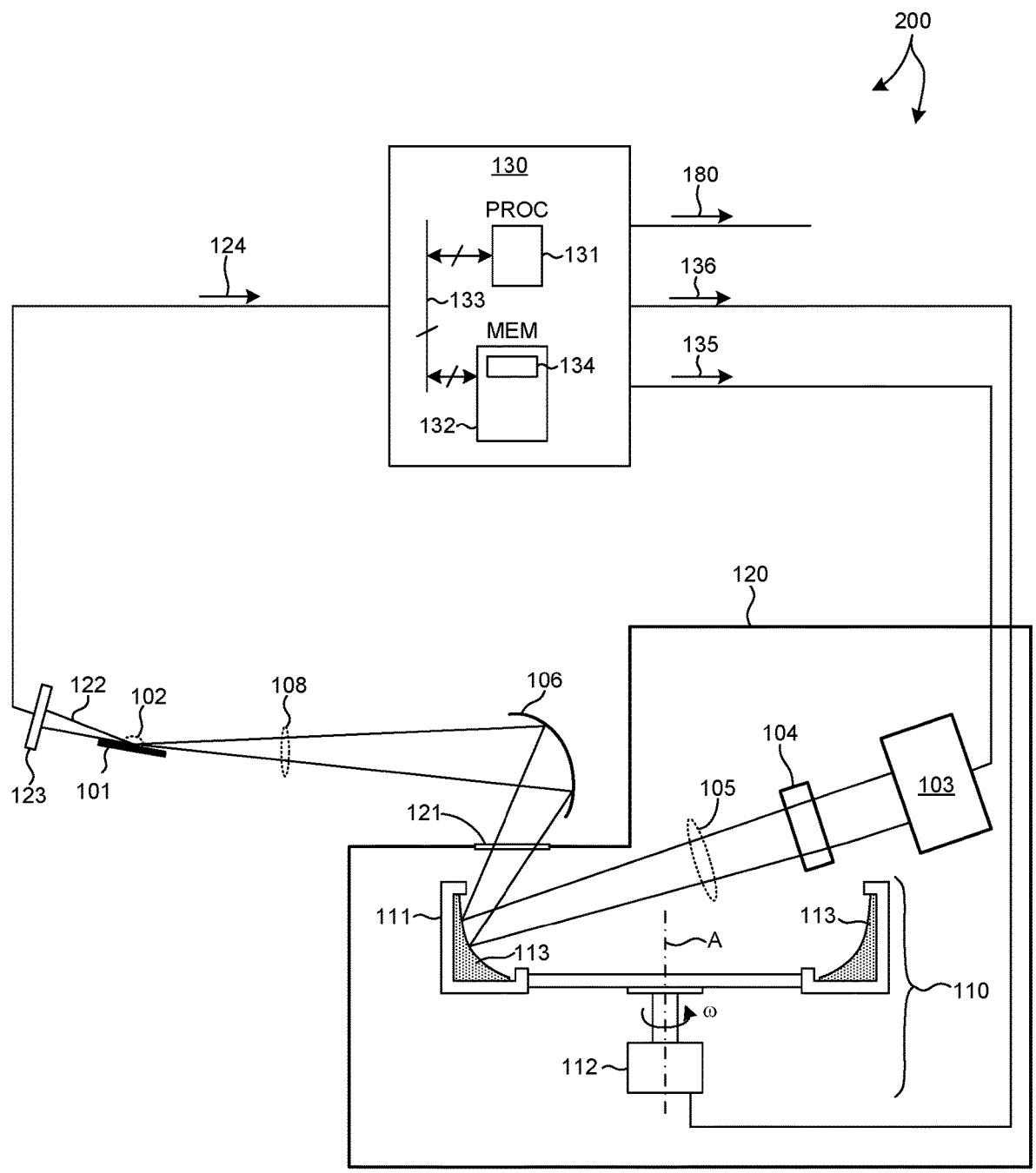
FIG. 9 is a diagram illustrative of an x-ray metrology system 200 for performing semiconductor metrology measurements including a LiMeRa x-ray illumination source.

FIG. 9 illustrates an x-ray metrology system 200 for performing semiconductor metrology measurements. By way of non-limiting example, x-ray metrology system 200 operates in a grazing incidence mode. More specifically, x-ray metrology system 200 is configured as a grazing incidence small-angle x-ray scattering (GISAXS) measurement system. Typical angles of incidence and collection are approximately one degree as measured from the surface of the specimen, or approximately eighty nine degrees from an axis normal to the surface of the specimen. X-ray metrology system 200 includes a LiMeRa x-ray illumination source as described with reference to FIG. 1. As illustrated in FIG. 9, x-ray metrology system 200 includes similar, like numbered elements described with reference to FIG. 1. X-ray metrology system 200 is configured such that x-rays which are scattered from the specimen are collected by a detector while a sample handler (not shown) positions the specimen. In addition any other particles produced during the interaction such as photoelectrons, x-rays produced through fluorescence, or ions can be detected. Metrology systems configured to perform GISAXS measurements require a high brightness x-ray source to maintain sufficient brightness over the relatively large sample area illuminated at small angles. For this reason, an LiMeRa x-ray illumination source is particularly well suited for GISAXS measurements.

By way of non-limiting example, the x-ray metrology system 100 illustrated in FIG. 1 is configured as a transmission small angle x-ray scatterometer (TSAXS) and the x-ray metrology system 200 illustrated in FIG. 9 is configured as a grazing incidence small angle x-ray scatterometer (GISAXS). However, in general, an x-ray metrology system employing a LiMeRa x-ray illumination source as described herein may employ any one or more of the following metrology techniques: transmission small angle x-ray scattering (TSAXS), grazing incidence small angle x-ray scattering (GISAXS), wide angle x-ray scattering (WAXS), x-ray reflectometry (XRR), grazing incidence x-ray reflectometry (GXR), x-ray diffraction (XRD), grazing incidence x-ray diffraction (GIXRD), high resolution x-ray diffraction (HRXRD), x-ray photoelectron spectroscopy (XPS), x-ray fluorescence (XRF), total reflection x-ray fluorescence (TXRF), grazing incidence x-ray fluorescence (GIXRF), x-ray tomography, x-ray ellipsometry, and hard x-ray photoemission spectrometry (HXPS).

X-ray metrology tool 100 also includes computing system 130 employed to acquire signals 124 generated by x-ray detector 123 and determine properties of the specimen based at least in part on the acquired signals. As illustrated in FIG.

1, computing system 130 is communicatively coupled to x-ray detector 123. In one example, x-ray detector 123 is an x-ray spectrometer and measurement data 124 includes an indication of the measured spectral response of the specimen based on one or more sampling processes implemented by the x-ray spectrometer. Computing system 130 is configured to build models of the specimen, create x-ray simulations based upon the models, and analyze the simulations and signals 124 received from x-ray detector 123 to determine one or more characteristics of the sample (e.g., a value of a parameter of interest 180 of a structure under measurement).

In a further embodiment, computing system 130 is configured to access model parameters in real-time, employing Real Time Critical Dimensioning (RTCD), or it may access libraries of pre-computed models for determining a value of at least one specimen parameter value associated with the specimen 101. In general, some form of CD-engine may be used to evaluate the difference between assigned CD parameters of a specimen and CD parameters associated with the measured specimen. Exemplary methods and systems for computing specimen parameter values are described in U.S. Pat. No. 7,826,071, issued on Nov. 2, 2010, to KLA-Tencor Corp., the entirety of which is incorporated herein by reference.

In one example, measurement data 124 includes an indication of the measured x-ray response of the specimen. Based on the distribution of the measured x-ray response on the surface of detector 123, the location and area of incidence of x-ray beam 108 on specimen 101 is determined by computing system 130. In one example, pattern recognition techniques are applied by computing system 130 to determine the location and area of incidence of x-ray beam 108 on specimen 101 based on measurement data 124. In response computing system 130 generates command signals to any of electron optics 104 and x-ray optics 109 to redirect and reshape incident x-ray illumination beam 108.

In another aspect, x-ray measurements of a particular inspection area are performed at a number of different out of plane orientations. This increases the precision and accuracy of measured parameters and reduces correlations among parameters by extending the number and diversity of data sets available for analysis to include a variety of large-angle, out of plane orientations. Measuring specimen parameters with a deeper, more diverse data set also reduces correlations among parameters and improves measurement accuracy.

As illustrated in FIG. 1, x-ray metrology tool 100 includes a specimen positioning system 140 configured to both align specimen 101 and orient specimen 101 over a large range of out of plane angular orientations with respect the LiMeRa x-ray illumination source. In other words, specimen positioning system 140 is configured to rotate specimen 101 over a large angular range about one or more axes of rotation aligned in-plane with the surface of specimen 101. In some embodiments, specimen positioning system 140 is configured to rotate specimen 101 within a range of at least 90 degrees about one or more axes of rotation aligned in-plane with the surface of specimen 101. In some embodiments, specimen positioning system is configured to rotate specimen 101 within a range of at least 60 degrees about one or more axes of rotation aligned in-plane with the surface of specimen 101. In some other embodiments, specimen positioning system is configured to rotate specimen 101 within a range of at least one degree about one or more axes of rotation aligned in-plane with the surface of specimen 101. In this manner, angle resolved measurements of specimen 101 are collected by x-ray metrology system 100 over any number of locations on the surface of specimen 101. In one example, computing system 130 communicates command signals to motion controller 145 of specimen positioning system 140 that indicate the desired position of specimen 101. In response, motion controller 145 generates command signals to the various actuators of specimen positioning system 140 to achieve the desired positioning of specimen 101. By way of non-limiting example, a specimen positioning system may include any combination of a hexapod, linear, and angular stages.

By way of non-limiting example, as illustrated in FIG. 1, specimen positioning system 140 includes an edge grip chuck 141 to fixedly attach specimen 101 to specimen positioning system 140. A rotational actuator 142 is configured to rotate edge grip chuck 141 and the attached specimen 101 with respect to a perimeter frame 143. In the depicted embodiment, rotational actuator 142 is configured to rotate specimen 101 about the x-axis of the coordinate system 146 illustrated in FIG. 1. As depicted in FIG. 1, a rotation of specimen 101 about the z-axis is an in plane rotation of specimen 101. Rotations about the x-axis and the y-axis (not shown) are out of plane rotations of specimen 101 that effectively tilt the surface of the specimen with respect to the metrology elements of metrology system 100. Although it is not illustrated, a second rotational actuator is configured to rotate specimen 101 about the y-axis. A linear actuator 144 is configured to translate perimeter frame 143 in the x-direction. Another linear actuator (not shown) is configured to translate perimeter frame 143 in the y-direction. In this manner, every location on the surface of specimen 101 is available for measurement over a range of out of plane angular positions. For example, in one embodiment, a location of specimen 101 is measured over several angular increments within a range of −45 degrees to +45 degrees with respect to the normal orientation of specimen 101.

The large, out of plane, angular positioning capability of specimen positioning system 140 expands measurement sensitivity and reduces correlations between parameters. For example, in a normal orientation, SAXS is able to resolve the critical dimension of a feature, but is largely insensitive to sidewall angle and height of a feature. However, collecting measurement data over a broad range of out of plane angular positions enables the collection of measurement data associated with a number of diffraction orders. This enables the sidewall angle and height of a feature to be resolved. In addition, other features such as rounding or any other shapes associated with advanced structures can be resolved.

A x-ray metrology tool employing a high brightness liquid metal droplet x-ray source as described herein enables increased measurement sensitivity and throughput due to the high brightness and short wavelength radiation (e.g., photon energy greater than 500 eV) generated by the source. By way of non-limiting example, the x-ray metrology tool is capable of measuring geometric parameters (e.g., pitch, critical dimension (CD), side wall angle (SWA), line width roughness (LWR), and line edge roughness (LER)) of structures smaller than 10 nanometers. In addition, the high energy nature of x-ray radiation penetrates optically opaque thin films, buried structures, high aspect ratio structures, and devices including many thin film layers.

A x-ray metrology system employing a high brightness LiMeRa x-ray illumination source as described herein may be used to determine characteristics of semiconductor structures. Exemplary structures include, but are not limited to, FinFETs, low-dimensional structures such as nanowires or graphene, sub 10 nm structures, thin films, lithographic structures, through silicon vias (TSVs), memory structures such as DRAM, DRAM 4F2, FLASH and high aspect ratio memory structures. Exemplary structural characteristics include, but are not limited to, geometric parameters such as line edge roughness, line width roughness, pore size, pore density, side wall angle, profile, film thickness, critical dimension, pitch, and material parameters such as electron density, crystalline grain structure, morphology, orientation, stress, and strain.

It should be recognized that the various steps described throughout the present disclosure may be carried out by a single computer system 130 or, alternatively, a multiple computer system 130. Moreover, different subsystems of the system 100, such as the specimen positioning system 140, may include a computer system suitable for carrying out at least a portion of the steps described herein. Therefore, the aforementioned description should not be interpreted as a limitation on the present invention but merely an illustration. Further, the one or more computing systems 130 may be configured to perform any other step(s) of any of the method embodiments described herein.

In addition, the computer system 130 may be communicatively coupled to the x-ray detector 123, electron optics 104, x-ray optics 106, electron beam source 103, rotary actuator 112, translational actuator 114, and specimen positioning system 140 in any manner known in the art. For example, the one or more computing systems 130 may be coupled to computing systems associated with x-ray detector 123, electron optics 104, x-ray optics 106, electron beam source 103, rotary actuator 112, translational actuator 114, and specimen positioning system 140, respectively. In another example, any of x-ray detector 123, electron optics 104, x-ray optics 106, electron beam source 103, rotary actuator 112, translational actuator 114, and specimen positioning system 140 may be controlled directly by a single computer system coupled to computer system 130.

The computer system 130 of the x-ray metrology system 100 may be configured to receive and/or acquire data or information from the subsystems of the system (e.g., x-ray detector 123, electron optics 104, x-ray optics 106, electron beam source 103, rotary actuator 112, translational actuator 114, and specimen positioning system 140, and the like) by a transmission medium that may include wireline and/or wireless portions. In this manner, the transmission medium may serve as a data link between the computer system 130 and other subsystems of the system 100.

Computer system 130 of the metrology systems 100 and 200 may be configured to receive and/or acquire data or information (e.g., measurement results, modeling inputs, modeling results, etc.) from other systems by a transmission medium that may include wireline and/or wireless portions. In this manner, the transmission medium may serve as a data link between the computer system 130 and other systems (e.g., memory on-board metrology system 100, external memory, or external systems). For example, the computing system 130 may be configured to receive measurement data (e.g., output signals 124) from a storage medium (i.e., memory 132) via a data link. For instance, spectral results obtained using a spectrometer of x-ray detector 123 may be stored in a permanent or semi-permanent memory device (e.g., memory 132). In this regard, the spectral results may be imported from on-board memory or from an external memory system. Moreover, the computer system 130 may send data to other systems via a transmission medium. For instance, specimen parameter values 180 determined by computer system 130 may be stored in a permanent or semi-permanent memory device. In this regard, measurement results may be exported to another system.

Computing system 130 may include, but is not limited to, a personal computer system, mainframe computer system, workstation, image computer, parallel processor, or any other device known in the art. In general, the term "computing system" may be broadly defined to encompass any device having one or more processors, which execute instructions from a memory medium.

Program instructions 134 implementing methods such as those described herein may be transmitted over a transmission medium such as a wire, cable, or wireless transmission link. For example, as illustrated in FIG. 1, program instructions stored in memory 132 are transmitted to processor 131 over bus 133. Program instructions 134 are stored in a computer readable medium (e.g., memory 132). Exemplary computer-readable media include read-only memory, a random access memory, a magnetic or optical disk, or a magnetic tape.

In some embodiments, x-ray metrology as described herein is implemented as part of a fabrication process tool. Examples of fabrication process tools include, but are not limited to, lithographic exposure tools, film deposition tools, implant tools, and etch tools. In this manner, the results of x-ray measurements are used to control a fabrication process. In one example, x-ray measurement data collected from one or more targets is sent to a fabrication process tool. The x-ray data is analyzed and the results used to adjust the operation of the fabrication process tool.

Figure 10:
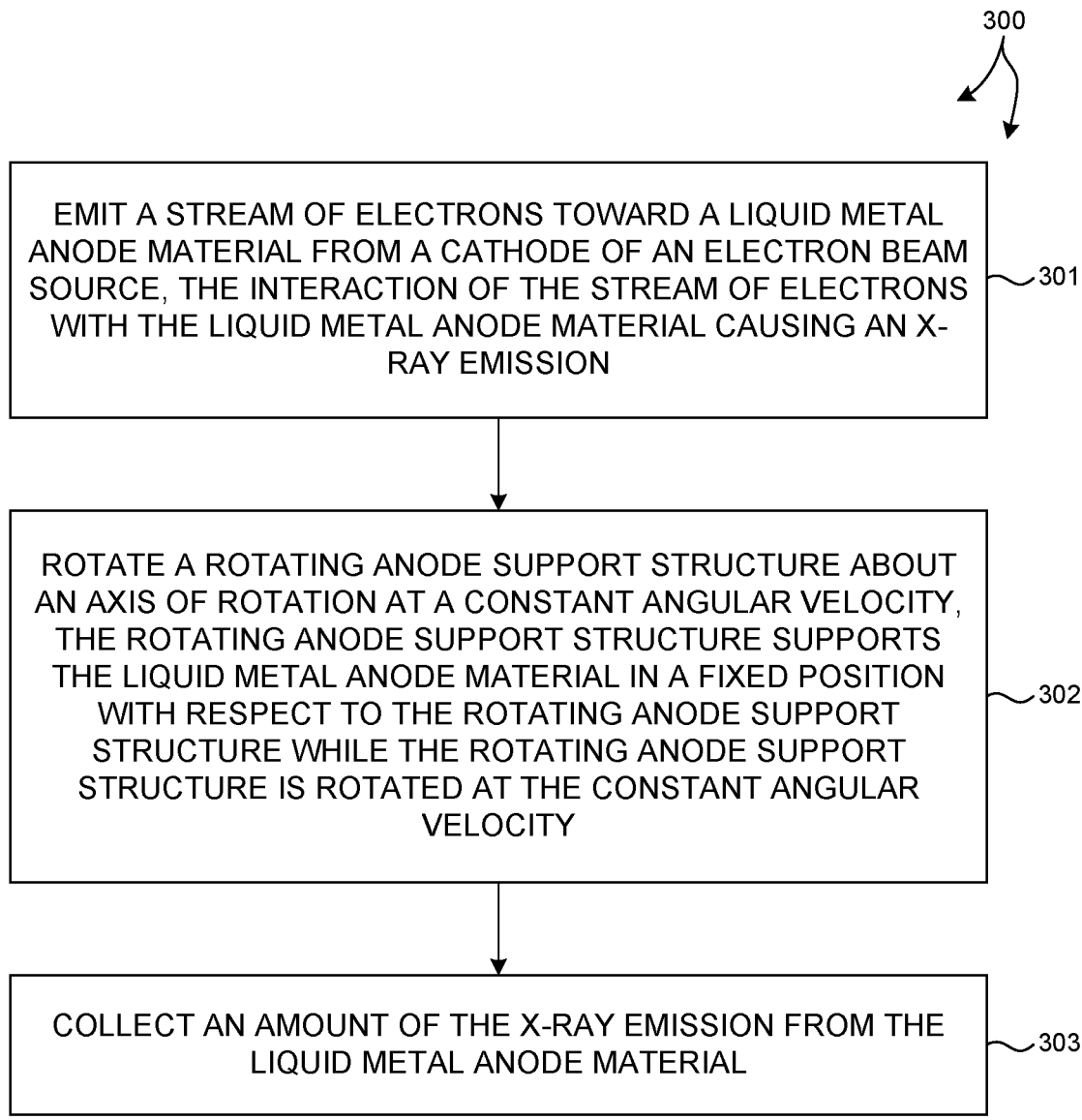
FIG. 10 is a flowchart illustrative of an exemplary method 300 suitable for generating x-ray emission from a LiMeRa x-ray illumination source.

FIG. 10 illustrates a method 300 suitable for implementation by the x-ray metrology systems 100 and 200 of the present invention. In one aspect, it is recognized that any data processing elements of method 300 may be carried out via a pre-programmed algorithm executed by one or more processors of computing system 130. While the following description is presented in the context of x-ray metrology systems 100 and 200, it is recognized herein that the particular structural aspects of x-ray metrology system 100 do not represent limitations and should be interpreted as illustrative only.

In block 301, a stream of electrons is emitted toward a liquid metal anode material from a cathode of an electron beam source. The interaction of the stream of electrons with the liquid metal anode material causes an x-ray emission.

In block 302, rotating anode support structure rotates about an axis of rotation at a constant angular velocity. The rotating anode support structure supports the liquid metal anode material in a fixed position with respect to the rotating anode support structure while the rotating anode support structure is rotating at the constant angular velocity.

In block 303, an amount of the x-ray emission is collected from the liquid metal anode material.

As described herein, the term "critical dimension" includes any critical dimension of a structure (e.g., bottom critical dimension, middle critical dimension, top critical dimension, sidewall angle, grating height, etc.), a critical dimension between any two or more structures (e.g., distance between two structures), and a displacement between two or more structures (e.g., overlay displacement between overlaying grating structures, etc.). Structures may include three dimensional structures, patterned structures, overlay structures, etc.

As described herein, the term "critical dimension application" or "critical dimension measurement application" includes any critical dimension measurement.

As described herein, the term "metrology system" includes any system employed at least in part to characterize a specimen in any aspect, including critical dimension applications and overlay metrology applications. However, such terms of art do not limit the scope of the term "metrology system" as described herein. In addition, the metrology system 100 may be configured for measurement of patterned wafers and/or unpatterned wafers. The metrology system may be configured as a LED inspection tool, edge inspection tool, backside inspection tool, macro-inspection tool, or multi-mode inspection tool (involving data from one or more platforms simultaneously), and any other metrology or inspection tool that benefits from a liquid droplet x-ray source.

Various embodiments are described herein for a semiconductor processing system (e.g., an inspection system or a lithography system) that may be used for processing a specimen. The term "specimen" is used herein to refer to a wafer, a reticle, or any other sample that may be processed (e.g., printed or inspected for defects) by means known in the art.

As used herein, the term "wafer" generally refers to substrates formed of a semiconductor or non-semiconductor material. Examples include, but are not limited to, monocrystalline silicon, gallium arsenide, and indium phosphide. Such substrates may be commonly found and/or processed in semiconductor fabrication facilities. In some cases, a wafer may include only the substrate (i.e., bare wafer). Alternatively, a wafer may include one or more layers of different materials formed upon a substrate. One or more layers formed on a wafer may be "patterned" or "unpatterned." For example, a wafer may include a plurality of dies having repeatable pattern features.

A "reticle" may be a reticle at any stage of a reticle fabrication process, or a completed reticle that may or may not be released for use in a semiconductor fabrication facility. A reticle, or a "mask," is generally defined as a substantially transparent substrate having substantially opaque regions formed thereon and configured in a pattern. The substrate may include, for example, a glass material such as amorphous SiO2. A reticle may be disposed above a resist-covered wafer during an exposure step of a lithography process such that the pattern on the reticle may be transferred to the resist.

One or more layers formed on a wafer may be patterned or unpatterned. For example, a wafer may include a plurality of dies, each having repeatable pattern features. Formation and processing of such layers of material may ultimately result in completed devices. Many different types of devices may be formed on a wafer, and the term wafer as used herein is intended to encompass a wafer on which any type of device known in the art is being fabricated.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A liquid metal rotating anode x-ray illumination source, comprising:
    an electron beam source configured to emit a stream of electrons toward a liquid metal anode material from a cathode of the electron beam source, the interaction of the stream of electrons with the liquid metal anode material causing an x-ray emission; and
    a rotating anode assembly, comprising:
        a rotating anode support structure configured to rotate about an axis of rotation at a constant angular velocity, wherein the rotating anode support structure supports the liquid metal anode material in a fixed position with respect to the rotating anode support structure while the rotating anode support structure is rotated at the constant angular velocity; and
        a rotational actuator coupled to the rotating anode support structure, wherein the rotational actuator rotates the rotating anode support structure at the constant angular velocity.

2. The liquid metal rotating anode x-ray illumination source of claim 1, further comprising:
    at least one x-ray optical element configured to collect an amount of the x-ray emission from the liquid metal anode material.

3. The liquid metal rotating anode x-ray illumination source of claim 2, wherein the collected amount of x-ray emission is transmitted through a portion of the rotating anode assembly from the liquid metal anode material to the at least one x-ray optical element.

4. The liquid metal rotating anode x-ray illumination source of claim 3, the rotating anode assembly further comprising:
    an output window coupled to the rotating anode support structure, wherein the output window is transparent to the x-ray emission, and wherein the collected amount of x-ray emission is transmitted through the output window from the liquid metal anode material to the at least one x-ray optical element.

5. The liquid metal rotating anode x-ray illumination source of claim 1, the rotating anode assembly further comprising:
    a containment window coupled to the rotating anode support structure, wherein the containment window constrains the liquid metal anode material to a fixed position with respect to the rotating anode support structure while the rotating anode support structure is rotated at the constant angular velocity, wherein the containment window is transparent to the stream of electrons, and wherein the stream of electrons is transmitted through the containment window from the electron beam source to the liquid metal anode material.

6. The liquid metal rotating anode x-ray illumination source of claim 1, the rotating anode assembly further comprising:
   a translational actuator coupled to the rotating anode support structure, wherein the translational actuator translates the rotating anode support structure in a direction parallel to the axis of rotation.

7. The liquid metal rotating anode x-ray illumination source of claim 1, wherein the rotating anode support structure supports the liquid metal anode material such that the liquid metal anode material assumes a shape that depends on an angular velocity of rotation of the rotating anode support structure.

8. The liquid metal rotating anode x-ray illumination source of claim 1, wherein the rotating anode support structure supports the liquid metal anode material such that a cross-section of the liquid metal anode material at any location along a focal track of the liquid metal rotating anode x-ray illumination source assumes a constant shape independent of an angular velocity of rotation of the rotating anode support structure.

9. An x-ray based metrology system comprising:
   a liquid metal rotating anode x-ray illumination source configured to illuminate an inspection area of a specimen with an incident x-ray beam, wherein the liquid metal rotating anode x-ray illumination source includes,
      an electron beam source configured to emit a stream of electrons toward a liquid metal anode material from a cathode of the electron beam source, the interaction of the stream of electrons with the liquid metal anode material causing an x-ray emission;
      a rotating anode assembly, comprising:
         a rotating anode support structure configured to rotate about an axis of rotation at a constant angular velocity, the rotating anode support structure supports the liquid metal anode material in a fixed position with respect to the rotating anode support structure while the rotating anode support structure is rotated at the constant angular velocity; and
         a rotational actuator coupled to the rotating anode support structure, wherein the rotational actuator rotates the rotating anode support structure at the constant angular velocity;
   at least one x-ray optical element configured to collect an amount of the x-ray emission from the liquid metal anode material; and
   an x-ray detector configured to receive radiation from the specimen in response to the incident x-ray beam and generate signals indicative of a first property of the specimen.

10. The x-ray based metrology system of claim 9, wherein the x-ray based metrology system is a small angle x-ray scatterometer configured to perform measurements in a transmissive or a reflective mode.

11. The x-ray based metrology system of claim 10, wherein the measurements are critical dimension measurement, overlay measurements, or both.

12. The x-ray based metrology system of claim 9, wherein the x-ray based metrology system is configured as any of a transmission small angle x-ray scatterometry system, a grazing incidence small angle x-ray scatterometry system, a wide angle x-ray scatterometry system, a x-ray reflectometry system, a grazing incidence x-ray reflectometry system, a x-ray diffractometry system, a grazing incidence x-ray diffractometry system, a high resolution x-ray diffractometery system, a x-ray photoelectron spectrometry system, a x-ray fluorescence metrology system, a total reflection x-ray fluorescence metrology system, a grazing incidence x-ray fluorescence metrology system, a x-ray tomography system, a x-ray ellipsometry system, and a hard x-ray photoemission spectrometry system.

13. The x-ray based metrology system of claim 9, wherein the collected amount of x-ray emission is transmitted through a portion of the rotating anode assembly from the liquid metal anode material to the at least one x-ray optical element.

14. The x-ray based metrology system of claim 13, the rotating anode assembly further comprising:
   an output window coupled to the rotating anode support structure, wherein the output window is transparent to the x-ray emission, and wherein the collected amount of x-ray emission is transmitted through the output window from the liquid metal anode material to the at least one x-ray optical element.

15. The x-ray based metrology system of claim 9, the rotating anode assembly further comprising:
   a containment window coupled to the rotating anode support structure, wherein the containment window constrains the liquid metal anode material to a fixed position with respect to the rotating anode support structure while the rotating anode support structure is rotated at the constant angular velocity, wherein the containment window is transparent to the stream of electrons, and wherein the stream of electrons is transmitted through the containment window from the electron beam source to the liquid metal anode material.

16. The x-ray based metrology system of claim 9, wherein the rotating anode support structure supports the liquid metal anode material such that the liquid metal anode material assumes a shape that depends on an angular velocity of rotation of the rotating anode support structure.

17. The x-ray based metrology system of claim 9, wherein the rotating anode support structure supports the liquid metal anode material such that a cross-section of the liquid metal anode material at any location along a focal track of the liquid metal rotating anode x-ray illumination source assumes a constant shape independent of an angular velocity of rotation of the rotating anode support structure.

18. A method comprising:
   emitting a stream of electrons toward a liquid metal anode material from a cathode of an electron beam source, the interaction of the stream of electrons with the liquid metal anode material causing an x-ray emission;
   rotating a rotating anode support structure about an axis of rotation at a constant angular velocity, the rotating anode support structure supporting the liquid metal anode material in a fixed position with respect to the rotating anode support structure while the rotating anode support structure is rotating at the constant angular velocity; and
   collecting an amount of the x-ray emission from the liquid metal anode material.

19. The method of claim 18, further comprising:

illuminating an inspection area of a specimen with an incident x-ray beam comprising the amount of the x-ray emission collected from the liquid metal anode material;

detecting an amount of radiation from the specimen in response to the incident x-ray beam; and generating signals indicative of a first property of the specimen based on the detected amount of radiation.

20. The method of claim 18, wherein the collected amount of x-ray emission is transmitted through an output window from the liquid metal anode material to the at least one x-ray optical element.

21. The method of claim 18, further comprising:

constraining the liquid metal anode material to a fixed position with respect to the rotating anode support structure by a containment window while the rotating anode support structure is rotated at the constant angular velocity; and transmitting the stream of electrons through the containment window from the electron beam source to the liquid metal anode material.

* * * * *